United States Patent [19]

Kiefer et al.

[11] Patent Number: 5,070,299
[45] Date of Patent: Dec. 3, 1991

[54] SLICE PROFILE OPTIMIZATION FOR A NUCLEAR MAGNETIC RESONANCE TOMOGRAPHY APPARATUS OPERATED WITH A GRADIENT ECHO SEQUENCE

[75] Inventors: Berthold Kiefer, Erlangen; Franz Schmitt, Baiersdorf, both of Fed. Rep. of Germany

[73] Assignee: Siemens Aktiengesellschaft, Munich, Fed. Rep. of Germany

[21] Appl. No.: 543,141

[22] Filed: Jun. 25, 1990

[30] Foreign Application Priority Data

Jun. 23, 1989 [EP] European Pat. Off. ........ 89111498.5

[51] Int. Cl.$^5$ ............................................ G01R 33/20
[52] U.S. Cl. ................................................ 324/309
[58] Field of Search ............... 324/300, 306, 307, 311, 324/309, 313

[56] References Cited

U.S. PATENT DOCUMENTS

| | | | |
|---|---|---|---|
| 4,168,462 | 9/1979 | Ernst .................................. | 324/313 |
| 4,506,222 | 1/1988 | Edelstein et al. . | |
| 4,521,732 | 6/1985 | Pegg et al. ......................... | 324/300 |
| 4,680,546 | 7/1987 | Dumoulin ........................... | 324/307 |
| 4,701,708 | 10/1987 | Hardy et al. ....................... | 324/311 |
| 4,706,024 | 11/1987 | Dumoulin ........................... | 324/309 |
| 4,733,184 | 3/1988 | McKinnon et al. . | |
| 4,816,764 | 3/1989 | Weber et al. . | |
| 4,849,697 | 7/1989 | Cline et al. ......................... | 324/306 |
| 5,010,300 | 4/1991 | Paley et al. ........................ | 324/309 |

FOREIGN PATENT DOCUMENTS

3725705  8/1987  Fed. Rep. of Germany .

OTHER PUBLICATIONS

"RF Refocussed Variable Flip Angle MRI Using Optimal Pulse Modulation", Shah et al., IEEE Engineering in Medicine and Biology Society 10th Annual International Conference (1988), pp. 334–335.

"Localization in the Vivo$^{31}$P NMR Spectroscopy by Combining Surface Coils and Slice-Selective Saturation", Sauter et al., J. Mag. Res., vol. 75, No. 1 (1985), pp. 167–175.

"Low-Power NMR Volume Selection by Slicing z Magnetization," Brereton et al., Mag. Res. in Med., vol. 5, No. 6 (1987), pp. 586, 592.

"A Method for Correctly Setting the rf Flip Angle," Perman et al., Mag. Res. in Med., vol. 9, No. 1 (1989), pp. 16–24.

Primary Examiner—Michael J. Tokar

[57] ABSTRACT

In a nuclear magnetic resonance tomography apparatus, for slice profile optimization, a pre-saturation RF pulse is generated in the presence of a slice selection gradient before the excitation RF pulse in a gradient echo sequence. The frequency spectrum of the pre-saturation RF pulse is defined so that it excites regions of the slice which correspond to the edges of the excitation RF pulse. A spoiler gradient in the z-direction is generated between the pre-saturation RF pulse and the excitation RF pulse. As a result of the pre-saturation RF pulse, the dependency of the slice profile on the flip angle of the excitation RF pulse and on the relationship $T_R/T_1$ is reduced.

5 Claims, 5 Drawing Sheets

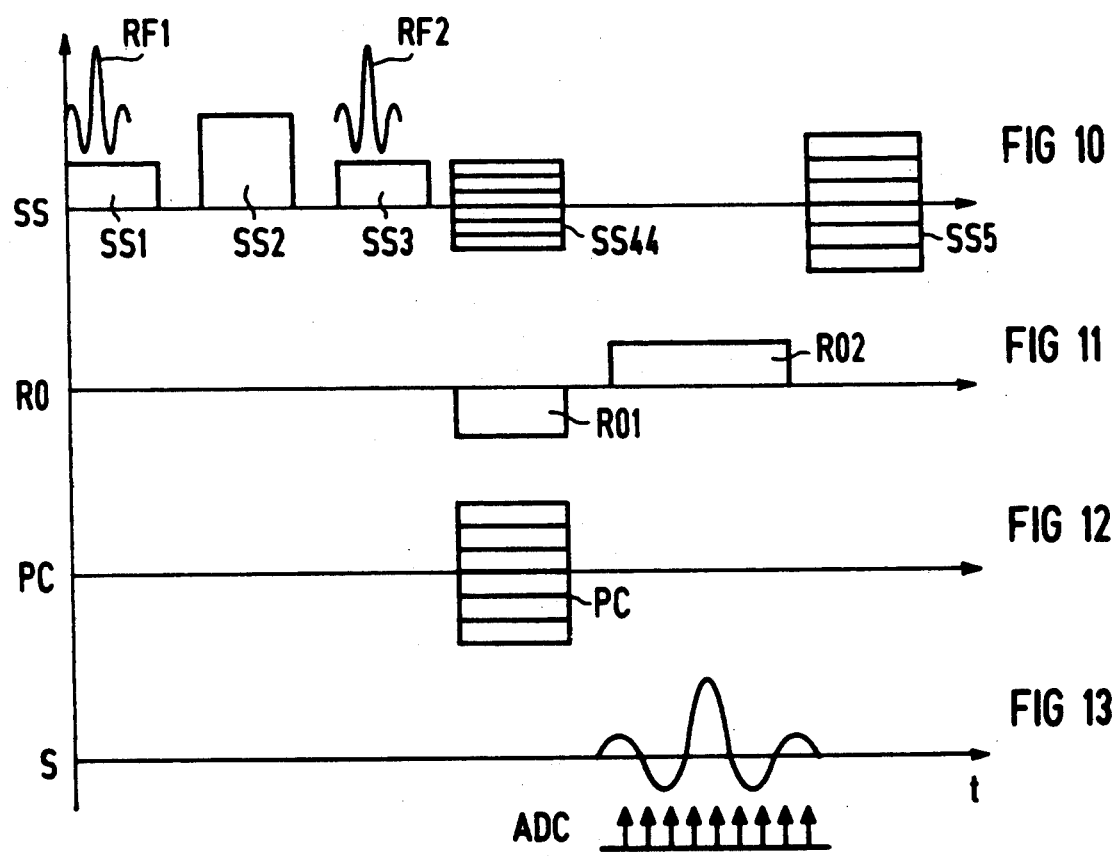

SLICE PROFILE OPTIMIZATION FOR A NUCLEAR MAGNETIC RESONANCE TOMOGRAPHY APPARATUS OPERATED WITH A GRADIENT ECHO SEQUENCE

BACKGROUND OF THE INVENTION

1. Field of the Invention

The present invention is directed to a method in the form of a pulse sequence for operating a nuclear magnetic resonance tomography apparatus, and in particular to a method suitable for use in the known gradient echo sequence.

1. Description of Prior Art

Nuclear magnetic resonance tomography devices (also known as magnetic resonance imaging devices) operate on the principle of exciting nuclear spins in a slice of an examination subject by means of an excitation RF pulse generated in the presence of a slice selection gradient in a first direction. The excited spins are phase-coded in a second direction, perpendicular to the first direction, by a phase-coding gradient. The resulting signal is read out under the influence of a read-out gradient in a third direction perpendicular to the first and second directions.

A problem in the operation of known magnetic resonance imaging devices shall be described with reference FIGS. 1 and 2. The slice of the examination subject is generally excited by generating a frequency-selective RF pulse in combination with a magnetic field gradient. The RF pulse generally corresponds to a "sync pulse" which deflects the nuclear spins by a flip angle $\alpha$ which is dependent on the position of the nuclear spins in the slice selection direction z. An exemplary curve for the flip angle $\alpha$ dependent on the z-coordinate in the slice selection direction is shown in FIG. 1.

Given fast pulse sequences, wherein the repetition time $T_R$ of the excitation RF pulses is shorter than the longitudinal relaxation time $T_1$, the cross-magnetization which occurs in the steady state, and which contributes exclusively to the nuclear magnetic resonance signal, is dependent, among other things, on the flip angle $\alpha$. There is thus a flip angle $\alpha_E$, dependent on the ratio $T_R/_1$, at which the signal intensity becomes maximum. This flip angle is known as the Ernst angle and is dependent on the ratio $T_R/T_1$ in accord with the following relationship:

$$\alpha_E = \text{arc cos}(\exp T_R/T_1).$$

The obtainable signal intensity S at a flip angle $\alpha$, and at the repetition time $T_R$ and at the longitudinal relaxation time $T_1$ is derived according to the following equation:

$$S \approx \sin\alpha(1-\exp(-T_R/T_1)(1-\exp(-T_R/T_1)\cos\alpha)^{-1}.$$

Because, as shown in FIG. 1, the flip angle $\alpha$ within the selected slice is dependent on the z-coordinate, the constant signal across the selected slice is not achieved in accordance with the equation immediately above, even given a uniform distribution of the nuclear spin density. According to equation immediately above, to the contrary, the shape of the slice profile is dependent on the selected, maximum flip angle $\alpha$ and on the ratio $T_R/T_1$. Slice profiles which, as desired, correspond to the Fourier transformation of the excitation RF pulses are excited for small flip angles $\alpha$, or for a high $T_R/T_1$ relationship. The signal contribution of the slice edges becomes greater than that of the slice center at a large flip angle $\alpha$. FIGS. 1 and 2 show this case. The maximum flip angle $\alpha$ lies in the middle of the slice over a flip angle $\alpha_E$ (Ernst angle) which is assumed to be 20°, and at which the cross-magnetization, and thus the signal intensity, become maximum.

Related thereto, FIG. 2 shows the signal curve S over the z-coordinate in the slice selection direction for a uniform nuclear spin density. The aforementioned effect of the signal exaggeration at the slice edges thus becomes clearly visible. The maxima of the signal are reached at those z-coordinates at which the flip angle $\alpha$ is equal to the Ernst angle $\alpha_E$, i.e. at 20° in the illustrated case.

The flip angle $\alpha$ is greater than the Ernst angle in the middle the slice, so that a lower signal appears at that region.

As stated above, the signal is dependent not only on the flip angle $\alpha$ but also on the ratio $T_R/T_1$. If noticeable differences in the longitudinal relaxation time $T_1$ occur within the tissue under examination, the shape and the half-width value of the slice profile within this tissue fluctuate with the longitudinal relaxation time $T_1$. In materials having long $T_1$, noticeably thicker slices, with distorted slice profiles, are excited than are excited in materials having a short $T_1$. This proves a series problem in, for example, examinations of the head, wherein great differences in the longitudinal relaxation time $T_1$ occur.

SUMMARY OF THE INVENTION

It is an object of the present invention to provide a pulse sequence for operating a magnetic resonance imaging apparatus wherein the dependency of the shape and the half-width value of the slice profile produced by the excitation RF pulse on the flip angle $\alpha$ and on the ratio $T_R/T_1$ are reduced.

This object is achieved in accordance with the principles of the present invention in a method employing a pulse sequence wherein a pre-saturation RF pulse is generated at the same slice position before the excitation RF pulse under the influence of the slice selection gradient, the frequency spectrum of the pre-saturation RF pulse is defined so that it excites regions of the slice corresponding to the edges of the excitation RF pulse. A spoiler gradient is generated between the pre-saturation RF pulse and the excitation RF pulse. The dependency of the shape and the half-width value of the slice profile on the flip angle $\alpha$ and on the relationship $T_R/T_1$ is thus clearly reduced.

The slice selection gradient preferably remains activated between the presaturation RF pulse and the excitation RF pulse, and thus functions as the spoiler gradient. No additional application of a separate gradient is thus required.

Alternatively, a separate spoiler gradient may be generated in the z-direction between the pre-saturation RF pulse and the excitation RF pulse. This has the advantage that the amplitude of the separate gradient can be arbitrarily selected, and thus, the necessary time duration can be shortened.

The pre-saturation RF pulse can be generated in each scan. Alternatively, only one pre-saturation RF pulse may be generated for a plurality of scans, if the measuring duration of these scans remains below the longitudinal relaxation time $T_1$, i.e. given extremely fast gradient echo sequences. As used herein, a scan encompasses the pulse sequence needed for generating a line (row) of the measuring matrix.

DESCRIPTION OF THE DRAWINGS

FIGS. 10-13 show the use of a pre-saturation RF pulse and an excitation RF pulse in accordance with the principles of the present invention in a three-dimensional gradient echo sequence.

DESCRIPTION OF THE PREFERRED EMBODIMENTS

Figure 1:
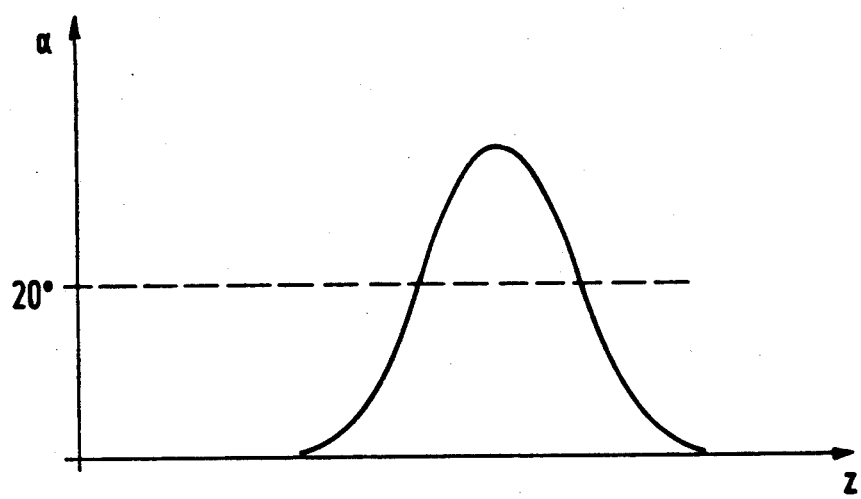
FIG. 1 shows the curve for the flip angle α dependent on the z-direction in a magnetic resonance imaging pulse sequence given a uniform distribution of the nuclear spin density.
Figure 2:
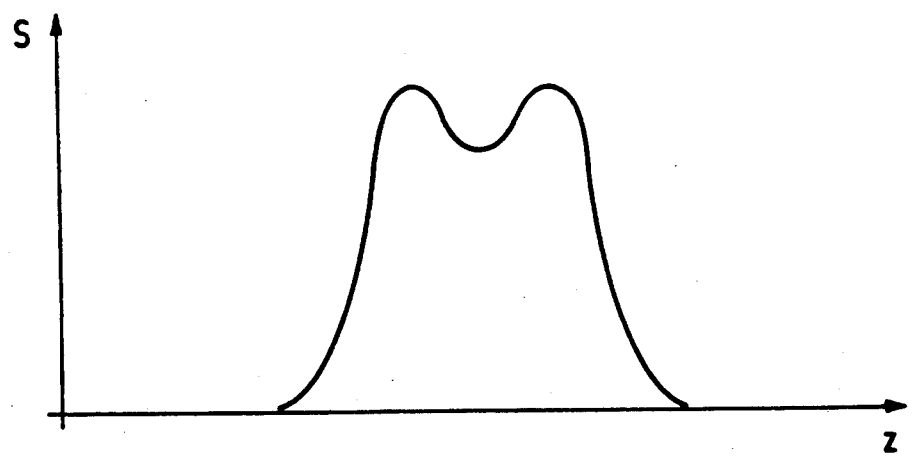
FIG. 2 shows the curve for the magnetic resonance signal S in the z-direction corresponding to the flip angle curve shown in FIG. 1.
Figure 3:
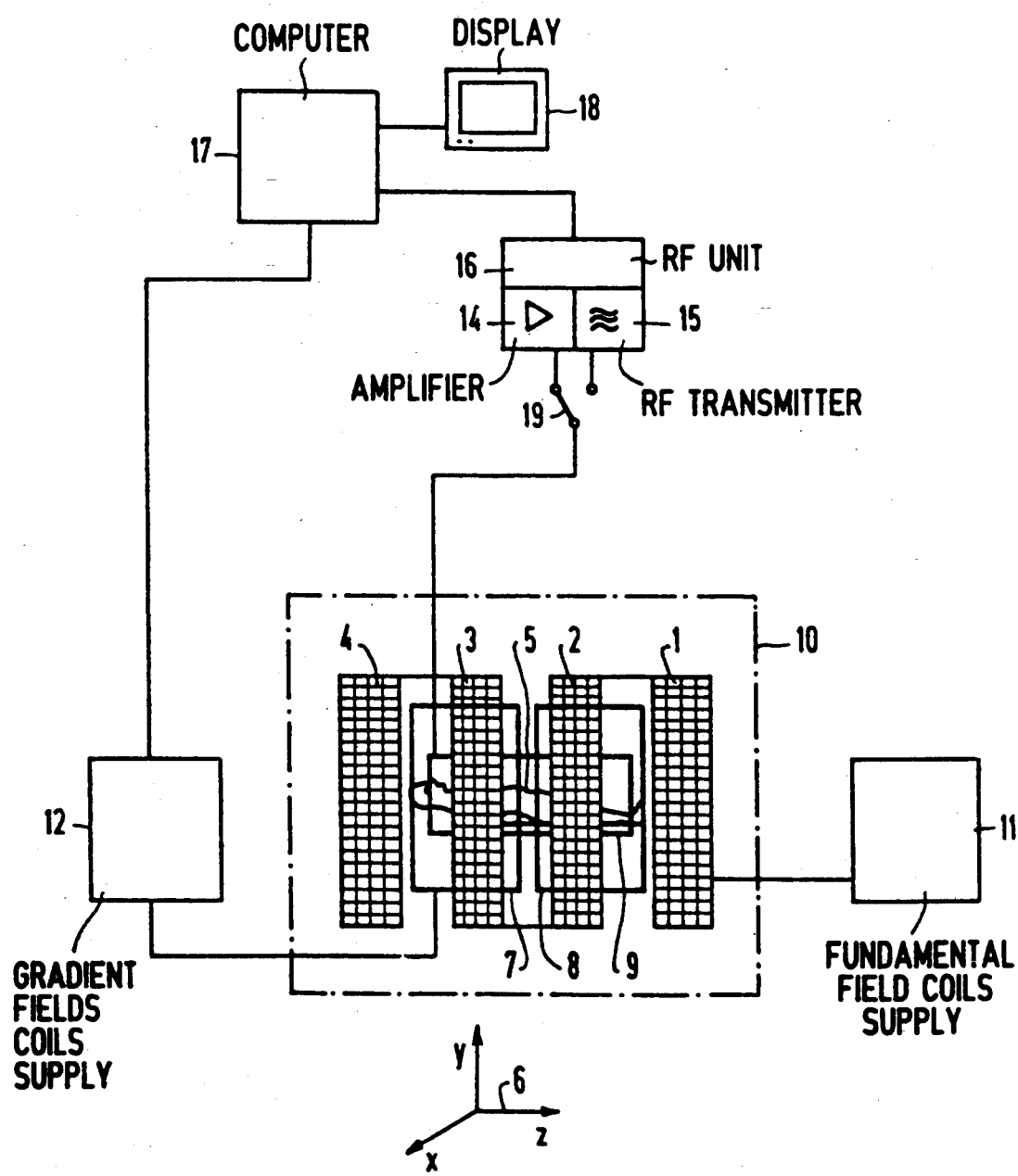
FIG. 3 is a schematic block diagram of a magnetic resonance imaging tomography apparatus operable in accordance with the pulse sequence disclosed herein.

The basic components of a magnetic resonance imaging tomography apparatus operable in the accordance with the principles of the present invention are shown in FIG. 3 A fundamental magnetic field is generated by coils 1, 2, 3 and 4 in which, if used for medical diagnostics, the body 5 of a patient to be examined is disposed. Sets of gradient coils are also provided which respectively generate independent, orthogonal magnetic field components in the x, y and z-directions, conforming to the coordinate axis 6. For clarity, only the gradient coil set consisting of gradient coils 7 and 8 is shown in FIG. 3, which, in combination with a pair of identical gradient coils (not shown) disposed on the opposite side of the body 5, generate an x-gradient. Sets of y-gradient coils (not shown) are disposed above and below the body 5 and parallel thereto, and sets of z-gradient coils (not shown) are disposed at the head and feet end of the patient, extending transversely to the longitudinal axes of the body 5.

The apparatus also includes a RF coil 9, which serves to generate and receive the nuclear magnetic resonance signals in the body 5. The coils 1, 2, 3, 4, 7, 8 and 9 (and the gradient coils not shown in the drawing) bounded by the dot-dash line 10 represent the actual examination instrument.

The examination instrument is operated by an electrical arrangement which includes a power supply 11 for the fundamental field coils 1-4 and a gradient fields coils power supply 12, to which the gradient coils 7 and 8 and the further gradient coils are connected. The RF coil 9 is connectable via a switch 19 to either an amplifier 14 or an RF transmitter 15, which in combination form an RF unit 16. The RF coil 9 is connected to the RF transmitter 15 in a signal transmission mode, for exciting nuclear spins in the body 5, and is connected to the amplifier 14 in a signal receiving mode, wherein the resulting nuclear magnetic resonance signals are registered. These signals are supplied from the RF unit 16 to a computer 17, which also controls the operation of the gradient fields coils supply 12. The computer 17 constructs a visual image of the examination slice from the received nuclear magnetic resonance signals, which is shown on a display 18.

A number of pulse sequences are known for operating the RF unit 16 and the gradient coils. Methods have generally prevailed wherein the image generation is bases on a two-dimensional or three-dimensional Fourier transformation of the acquired measured values.

Figure 4:
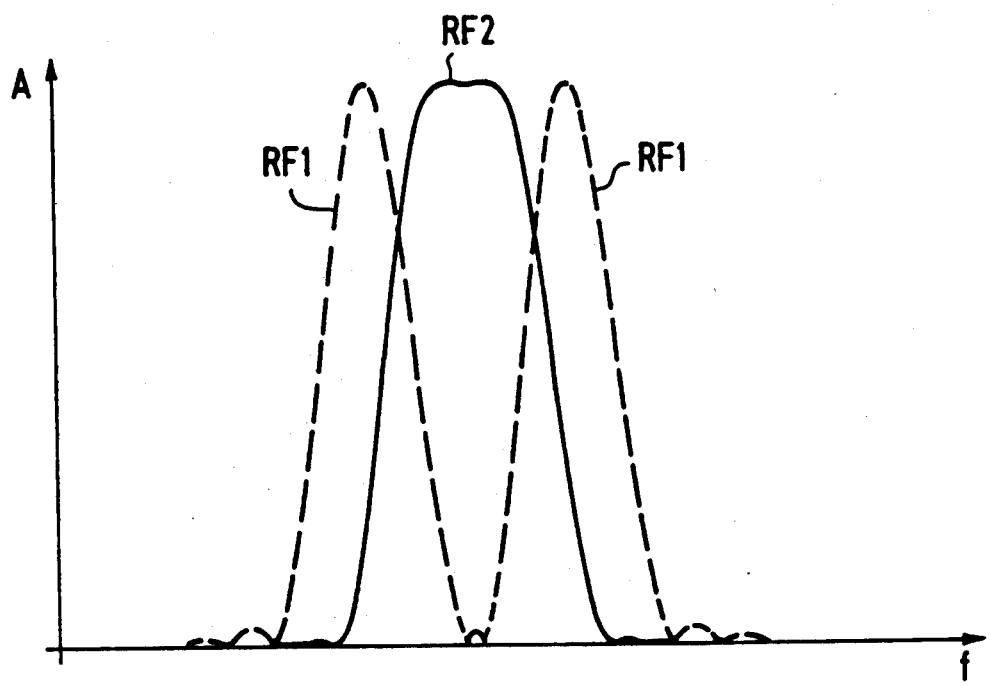
FIG. 4 shows the respective amplitudes of a pre-saturation RF pulse and an excitation RF pulse plotted with respect to frequency, of the type used in the pulse sequence disclosed herein.

The fundamental concept of the present invention is shown in FIG. 4, wherein the amplitudes of an RF excitation pulse RF2 and a pre-saturation pulse RF1 are shown as a function of the frequency.

To diminish the dependency of the shape of the slice profile on the flip angle α of the excitation RF pulse RF2 and on the relationship $T_R/T_1$, the selective excitation RF pulse RF2 is preceded by a specifically shaped, selective pre-saturation pulse RF1. The pre-saturation RF pulse RF 1 should only excite regions which correspond to the edges of the excitation RF pulse RF2. The pre-saturation RF pulse RF1 is fashioned so that the longitudinal magnetization which occurs in equilibrium is constant over the excitation region of the excitation Rf pulse Rf2. As shown in FIG. 4, the excitation RF pulse RF2, as usual, corresponds to a Hamming-filtered sync pulse. The pre-saturation RF pulse RF1 may, for example, be easily adapted or matched to the excitation RF pulse by conducting a few simple experimental runs, so that the maximum flip angle of the pulse RF1 corresponds to the flip angle in the middle of the slice of the excitation RF pulse RF2.

The pre-saturation RF pulse RF1 should not result in a contribution to the nuclear magnetic resonance signal. To eliminate undesired signal contributions of the pre-saturation Rf pulse RF1, a gradient spoiler pulse, which eliminates the $T_2$ phase coherency is needed.

FIGS. 6-9 show the application of the inventive concept of FIG. 4 to a two-dimensional gradient echo sequence. Such a sequence, without the pulses shown in FIG. 4, is described in detail in U.S. Pat. No. 4,506,222, and therefore the theory of generating an image using such a sequence need not be discussed in further detail herein.

Figure 5:
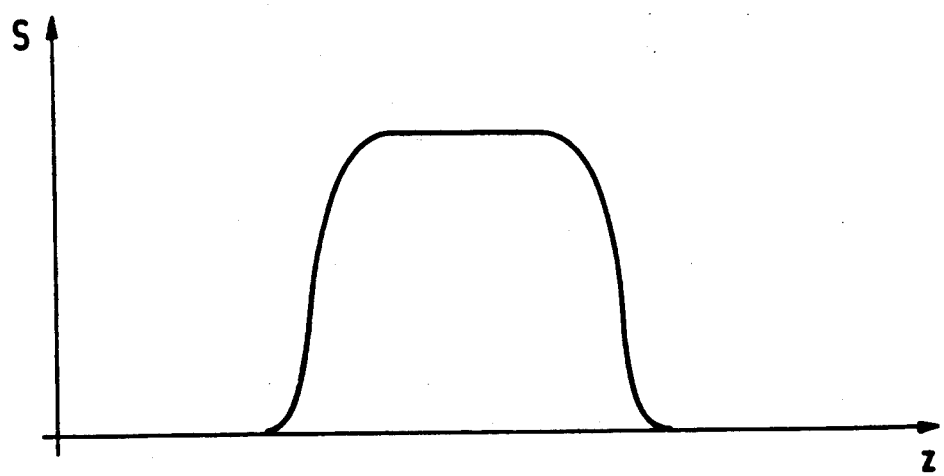
FIG. 5 shows the resulting slice profile generated with the pulses of FIG. 4.
Figure 6:
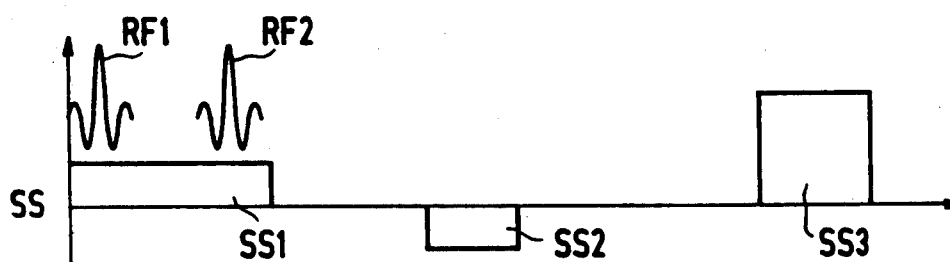
FIGS. 6-9 show the use of pre-saturation RF pulse and an excitation RF pulse in accordance with the principles of the present invention in the context of a two-dimensional gradient echo sequence.
Figure 7:
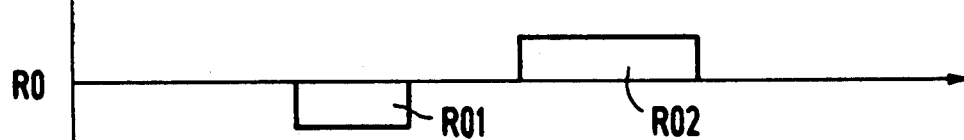
Figure 8:
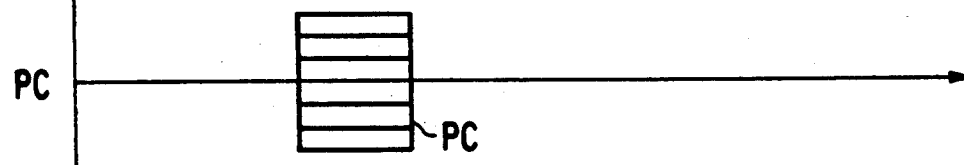
Figure 9:
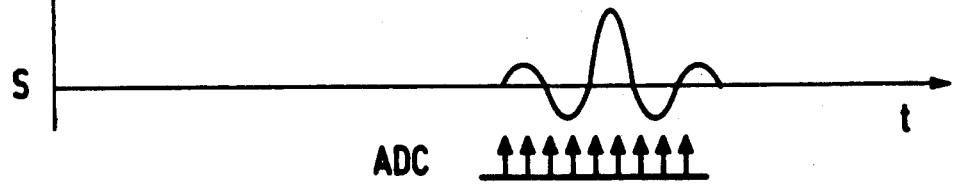

Each scan begins with a pre-saturation RF pulse RF1, which is generated simultaneously with a slice selection gradient SS1, so that the RF pulse RF1 acts only on one slice of the examination subject. The fashioning of this pre-saturation RF pulse RF1 has already been discussed in greater detail above in combination with the subsequent excitation RF pulse. The pre-saturation RF pulse RF1 is followed by the excitation RF pulse RF2, with the slice selection gradient SS1 continuing to be activated, so that the excitation RF pulse RF2 is also slice-selective. The slice selection gradient SS1 remains activated between the pre-saturation RF pulse RF1 and the excitation RF pulse RF2. Following the end of the pre-saturation RF pulse RF1, the slice selection gradient SS1 acts as a spoiler gradient which destroys the phase coherency of the cross-magnetization produced by the pre-saturation RF pulse RF1, and thus prevents an undesired signal contribution from the pulse RF1. This results in the excitation of a slice profile as shown in FIG. 5.

As in every gradient echo sequence, a dephasing gradient RO1 in the x-direction and a phase-coding gradient PC in y-direction, which changes from scan-to-scan, follow. Due to a re-phasing gradient SS2 in the z-direction, the dephasing effected by the slice selection gradient SS1 with respect to the signal portion of the excitation RF pulse RF2, is cancelled. Finally, the resulting nuclear magnetic resonance signal S is read out under a read-out gradient RO2, and is sampled by an analog-to-digital converter, schematically symbolized at ADC. The samples are written into row of a measurement matrix for each scan.

If the measurement matrix has a plurality of rows n, the above-described pulse sequence is repeated n-times with changing values of the phase-coding gradient PC. An image of the excited slice is then obtained by two-dimensional Fourier transformation of the matrix, in a known manner. A spoiler gradient SS3, which destroys the cross-magnetization remaining after each scan, is generated between successive scans in z-direction.

Another example of the pulse sequence is shown in FIGS. 10–13, again using the slice profile optimization of the invention. In this sequence, a pre-saturation pulse RF-1 is also initially generated simultaneously with a slice selection gradient SS1. A separate spoiler gradient SS2 in the z-direction follows. The use of a separate spoiler gradient has the advantage that its amplitude can be selected independently of the amplitude of the slice selection gradient SS1, which is prescribed by the slice to be selected. The spoiler gradient SS2 is followed by a slice-selective excitation RF pulse RF2, which is generated in the presence of a slice selective gradient SS3. Following the excitation, a phase-coding gradient SS4 in the z-direction, a phase-coding gradient PC in the y-direction, and a dephasing gradient RO1 in the x-direction are generated. The resulting nuclear magnetic resonant signal S is then read out under the influence of a read-out gradient RO2. The signal S is again sampled, converted into digital form, and entered into a row of a matrix.

This sequence of FIGS. 10–13 describes a three-dimensional FLASH sequence, i.e. an m×n×o measurement matrix is produced per signal S, given m sampling points. This is achieved by forwarding the phase-coding gradient SS4 is the z-direction from scan-to-scan for one dimension of the matrix, and forwarding the phase-coding gradient PC in the y-direction from scan-to-scan for a second dimension of the matrix. In this method, a broader slice is selected, because the excitation is intended only to delimit the region of interest, and a three-dimensional resolution is then achieved within this region of interest.

As in the pulse sequence of FIGS. 6–9, a spoiler pulse SS5 is generated in the slice selection direction z after each scan in the pulse sequence of FIGS. 10–13. The amplitude of the spoiler pulse SS5 can be changed from scan-to-scan.

The method disclosed herein for slice profile optimization is not limited to FLASH sequences, but may also be applied to any gradient echo sequence.

The dependency of the shape and width of the excited slice profile on the flip angle $\alpha$ and on the relationship $T_R/T_1$ is noticeably reduced with this method. Signal contributions from the slice edges are thus reduced, even with an unfavorable parameter selection. The width and shape of the slice profile also remains constant given examination subjects having a greater fluctuation in the longitudinal relaxation time $T_1$. The dependency of the $T_1$ contrast on the position in the slice selection direction is noticeably reduced. A reduction of the signal contributions occurring from flowing blood also ensues due to the pre-saturation pulse.

If the inventive steps are added to the FLASH pulse sequence, the $T_1$ image, i.e. an image of the $T_1$ distribution across the examination subject, can also be simply calculated after the registration of a series of images with different flip angles. The following relationship, derived by transformation from the first equation set forth earlier, applies:

$$S/\sin \alpha = \exp(-T_R/T_1) \times S/\tan \alpha + \text{Const.}$$

A linear relationship thus derives when $S/\sin \alpha$ is entered over $S/\tan \alpha$. This relationship can be used for calculating the $T_1$ image.

Although further modifications and changes may be suggested by those skilled in the art, it is the intention of the inventors to embody within the patent warranted hereon all changes and modifications as reasonably and properly come within the scope of their contribution to the art.

We claim as our invention:

1. In a method for operating a magnetic resonance imaging tomography apparatus using a gradient echo sequence including the steps of exciting nuclear spins in a slice of an examination subject by generating an excitation RF pulse in the presence of a slice selection gradient in a first direction, phase-coding the excited nuclear spins by a phase-coding gradient in a second direction perpendicular to said first direction to obtain a nuclear magnetic resonance signal, and reading out said nuclear magnetic resonance signal in the presence of a read-out gradient in a third direction perpendicular to said first and second directions, the improvement comprising:
    generating a pre-saturation RF pulse in said slice selected by said slice selection gradient before generating said excitation RF pulse, said presaturation RF pulse having a frequency spectrum which excites regions of said slice corresponding to the edges of said RF excitation pulse; and
    generating a spoiler gradient between said pre-saturation RF pulse and said excitation RF pulse.

2. The improvement of claim 1 wherein the step of generating a spoiler gradient is further defined by maintaining said slice selection gradient active between said pre-saturation RF pulse and said excitation RF pulse so that said slice selection gradient functions as said spoiler gradient.

3. The improvement of claim 1 wherein the step of generating a spoiler gradient is further defined by generating a separate spoiler gradient in said first direction between said pre-saturation RF pulse and said excitation RF pulse.

4. The improvement of claim 1 wherein completion of the step of reading out said nuclear magnetic resonance signal defines the end of a scan, and comprising the additional steps of:
    conducting a plurality of scans; and
    generating a pre-saturation RF pulse at a beginning of each scan.

5. The improvement of claim 1 wherein completion of the step of reading out said nuclear magnetic resonance signal defines the end of a scan, and comprising the additional steps of:
    conducting a plurality of scans; and
    generating only one pre-saturation RF pulse at a beginning of said plurality of scans.

* * * * *